(12) United States Patent
Shin et al.

(10) Patent No.: US 12,193,296 B2
(45) Date of Patent: Jan. 7, 2025

(54) CONDUCTIVE PATTERN HAVING FIRST AND SECOND CAPPING LAYERS AND DISPLAY DEVICE INCLUDING THE SAME

(71) Applicant: Samsung Display Co., Ltd., Yongin-Si (KR)

(72) Inventors: Hyun Eok Shin, Gyeonggi-do (KR); Do Keun Song, Yongin-si (KR); Dong Min Lee, Anyang-si (KR); Joon Yong Park, Gunpo-si (KR); Hyun Ah Sung, Suwon-si (KR); Yun Jong Yeo, Hwaseong-si (KR); Dae Won Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 360 days.

(21) Appl. No.: 17/717,554

(22) Filed: Apr. 11, 2022

(65) Prior Publication Data
US 2023/0086407 A1    Mar. 23, 2023

(30) Foreign Application Priority Data
Sep. 17, 2021 (KR) .......................... 10-2021-0124985

(51) Int. Cl.
*H10K 59/131* (2023.01)

(52) U.S. Cl.
CPC ................................. *H10K 59/1315* (2023.02)

(58) Field of Classification Search
CPC ............. H10K 10/481; H10K 59/1315; H10K 59/1213
USPC ............................................. 257/59, 72, 347
See application file for complete search history.

(56) References Cited

U.S. PATENT DOCUMENTS

2007/0007527 A1    1/2007 Koyama
2022/0173360 A1*   6/2022 Cho ..................... H10K 59/879

FOREIGN PATENT DOCUMENTS

KR    10-0546724 B1    1/2006
KR    10-2019-0062661 A    6/2019

* cited by examiner

*Primary Examiner* — Hoai V Pham
(74) *Attorney, Agent, or Firm* — Innovation Counsel LLP

(57) ABSTRACT

A conductive pattern is disclosed that includes a conductive layer including aluminum, a first capping layer disposed on the conductive layer and including titanium, and a second capping layer disposed on the first capping layer and including titanium nitride. A mixed region in which the aluminum and the titanium are mixed with each other is disposed in at least portions of the conductive layer and the first capping layer.

20 Claims, 18 Drawing Sheets

CONDUCTIVE PATTERN HAVING FIRST AND SECOND CAPPING LAYERS AND DISPLAY DEVICE INCLUDING THE SAME

CROSS-REFERENCE TO RELATED APPLICATION

This application claims priority from Korean Patent Application No. 10-2021-0124985 filed on Sep. 17, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a conductive pattern and a display device including the same.

2. Description of the Related Art

As the information society develops, the demand for display devices for displaying images has increased and diversified. For example, display devices have been applied to various electronic devices such as smartphones, digital cameras, laptop computers, navigation devices, and smart televisions.

The display device may be a flat panel display device such as a liquid crystal display device, a field emission display device, or a light emitting display device. The light emitting display device includes an organic light emitting display device including an organic light emitting element, an inorganic light emitting display device including an inorganic light emitting element such as an inorganic semiconductor, and a micro light emitting display device including a micro light emitting element.

SUMMARY

Aspects of the present disclosure provide a conductive pattern in which erosion and loss may be prevented, and a display device including the same.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the disclosure, a conductive pattern comprises a conductive layer including aluminum, a first capping layer disposed on the conductive layer and including titanium, and a second capping layer disposed on the first capping layer and including titanium nitride, wherein a mixed region in which the aluminum and the titanium are mixed with each other is disposed in at least portions of the conductive layer and the first capping layer.

In an embodiment, the conductive layer includes aluminum alone or an aluminum alloy.

In an embodiment, the aluminum alloy includes additive materials, and the additive materials include one or more of nickel, lanthanum, titanium, and neodymium.

In an embodiment, a content of the additive materials is within a range and including 0.1 to 1 at % based on a total aluminum alloy.

In an embodiment, the conductive layer has a thickness within a range and including 1500 to 4000 Å.

In an embodiment, the first capping layer has a thickness within a range and including 50 to 300 Å.

In an embodiment, the second capping layer has a thickness within a range and including 500 to 1000 Å.

In an embodiment, the mixed region includes aluminum-titanium alloys (TiAlx).

In an embodiment, the mixed region has a concentration gradient in which a content of the titanium gradually decreases toward a lower surface of the conductive layer in the mixed region.

In an embodiment, the mixed region includes $TiAl_3$ alloys, $TiAl_2$ alloys, and TiAl alloys.

In an embodiment, the $TiAl_3$ alloys are adjacent to the second capping layer in the mixed region, and the TiAl alloys are adjacent to a lower surface of the conductive layer in the mixed region.

In an embodiment, the mixed region has a thickness of 100 to 600 Å.

In an embodiment, an atomic ratio of nitrogen to titanium in the second capping layer is 0.8 or more.

According to an embodiment of the disclosure, a display device comprises a substrate, at least one transistor disposed on the substrate, and a light emitting element disposed on the transistor, wherein the transistor includes at least one conductive pattern, and the conductive pattern includes a conductive layer including aluminum, a first capping layer disposed on the conductive layer and including titanium, and a second capping layer disposed on the first capping layer and including titanium nitride, and a mixed region in which the aluminum and the titanium are mixed with each other is disposed in at least portions of the conductive layer and the first capping layer.

In an embodiment, the at least one conductive pattern includes a gate electrode.

In an embodiment, the at least one transistor includes a semiconductor layer, the gate electrode disposed on the semiconductor layer, and a source electrode and a drain electrode each connected to the semiconductor layer.

In an embodiment, the conductive pattern further includes a third capping layer disposed on the second capping layer and including the same material as the first capping layer and a fourth capping layer disposed on the third capping layer and including the same material as the second capping layer.

In an embodiment, the mixed region includes aluminum-titanium alloys (TiAlx).

In an embodiment, the mixed region has a concentration gradient in which a content of the titanium gradually decreases toward a lower surface of the conductive layer in the mixed region.

In an embodiment, the mixed region includes $TiAl_3$ alloys, $TiAl_2$ alloys, and TiAl alloys, and the $TiAl_3$ alloys are adjacent to the second capping layer in the mixed region, and the TiAl alloys are adjacent to a lower surface of the conductive layer in the mixed region.

With the conductive pattern and the display device including the same according to exemplary embodiments, by forming the first capping layer on the conductive layer to form the mixed region including the titanium-aluminum alloys, it is possible to prevent the conductive layer from being lost due to high heat of laser.

In addition, by forming the second capping layer on the first capping layer, it is possible to prevent a hillock from occurring on a surface of the conductive layer and it is possible to prevent the conductive layer from being eroded by a cleaning liquid.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Embodiments of the present disclosure will now be described more fully hereinafter with reference to the accompanying drawings.

It will be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, specific exemplary embodiments will be described with reference to the accompanying drawings.

Figure 1:
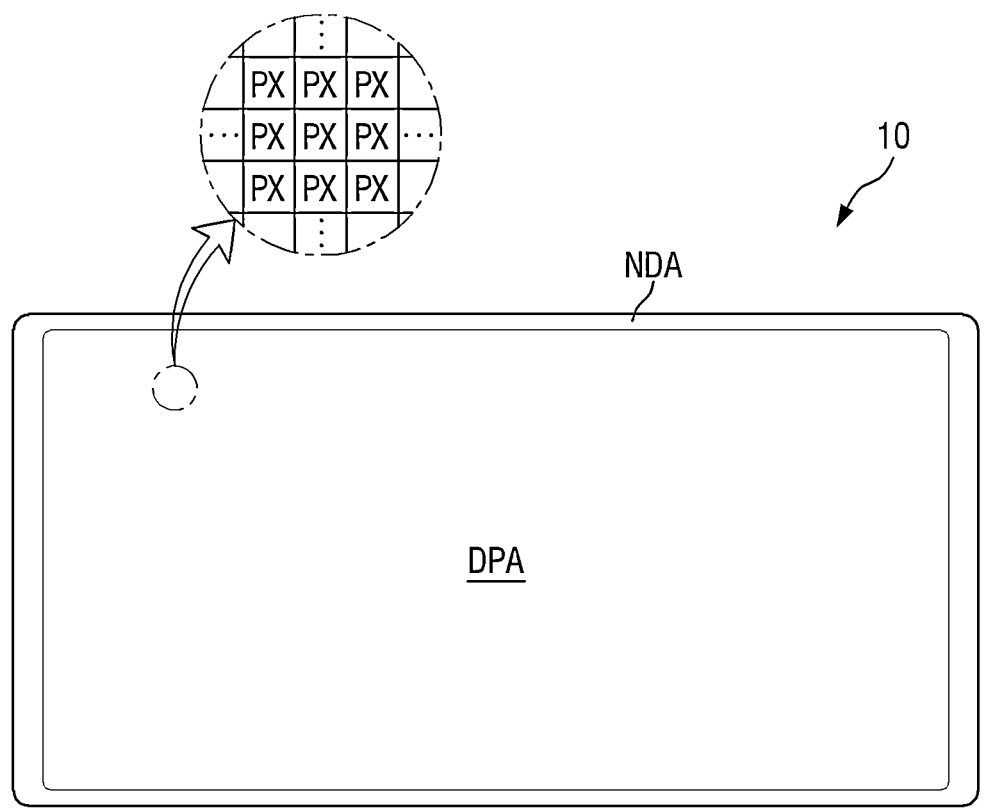
FIG. 1 is a schematic plan view of a display device according to an exemplary embodiment.
Figure 1:
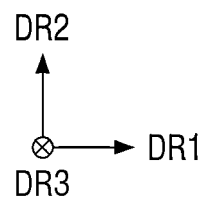

FIG. 1 is a schematic plan view of a display device according to an exemplary embodiment.

The terms "above", "top", and "upper surface" as used herein refer to an upward direction (i.e., one direction of a third direction DR3) with respect to a display device 10. The terms "under", "bottom", and "lower surface" as used herein refer to the other direction of the third direction DR3. In addition, "left", "right", "upper", and "lower" refer to directions when the display device 10 is viewed in plan view. For example, "left" refers to one direction of a first direction DR1, "right" refers to the other direction of the first direction DR1, "upper" refers to one direction of a second direction DR2, and "lower" refers to the other direction of the second direction DR2.

Referring to FIG. 1, the display device 10 may display a moving image or a still image. The display device 10 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display device 10.

The display device 10 may include a display panel providing a display screen. Examples of the display panel may include an inorganic light emitting diode display panel, an organic light emitting display panel, a quantum dot light emitting display panel, a plasma display panel, a field emission display panel, and the like. Hereinafter, a case where an inorganic light emitting diode display panel is applied as an example of the display panel will be described by way of example, but the present disclosure is not limited thereto, and the same technical spirit may be applied to other display panels if applicable.

A shape of the display device 10 may be variously changed. For example, the display device 10 may have a shape such as a rectangular shape with a width greater than a length, a rectangular shape with a length greater than a width, a square shape, a rectangular shape with rounded corners (vertices), other polygonal shapes, or a circular shape. A shape of a display area DPA of the display device 10 may also be similar to an overall shape of the display device 10. In FIG. 1, the display device 10 and the display area DPA having the rectangular shape with the width greater than the length are illustrated.

The display device 10 may include a display area DPA and a non-display area NDA. The display area DPA is an area in which a screen may be displayed, and the non-display area NDA is an area in which a screen is not displayed. The display area DPA may also be referred to as an active area, and the non-display area NDA may also be referred to as a non-active area. The display area DPA may occupy substantially the center of the display device 10.

The display area DPA may include a plurality of pixels PX. The plurality of pixels PX may be arranged in a matrix direction. A shape of each pixel PX may be a rectangular shape or a square shape in plan view, but is not limited thereto, and may also be a rhombic shape of which each side is inclined with respect to one direction. The respective pixels PX may be alternately arranged in a stripe type or a pentile type. In addition, each of the pixels PX may include one or more light emitting elements ED emitting light of a specific wavelength band to display a specific color.

The non-display area NDA may be disposed around the display area DPA. The non-display area NDA may entirely or partially surround the display area DPA. The display area DPA may have a rectangular shape, and the non-display area NDA may be disposed adjacent to four sides of the display area DPA. The non-display area NDA may constitute a bezel of the display device 10. Lines or circuit drivers included in the display device 10 may be disposed or external devices may be mounted, in each of the non-display areas NDA.

Figure 2:
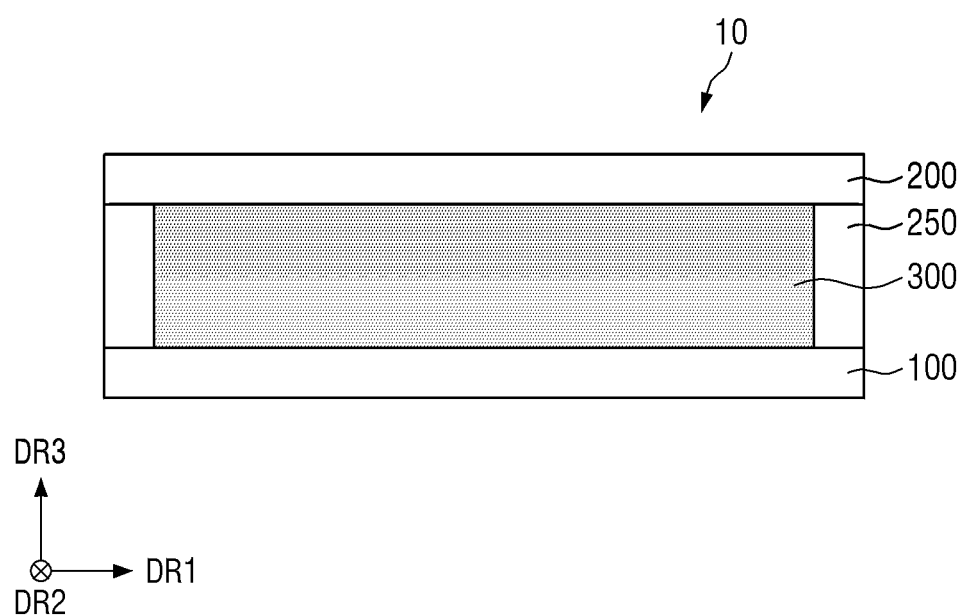
FIG. 2 is a schematic cross-sectional view of the display device according to an exemplary embodiment.

FIG. 2 is a schematic cross-sectional view of the display device according to an exemplary embodiment.

Referring to FIG. 2, the display device 10 according to an exemplary embodiment may include a display substrate 100, a counter substrate 200 facing the display substrate 100, a sealing part 250 coupling the display substrate 100 and the counter substrate 200 to each other, and a filler 300 filled between the display substrate 100 and the counter substrate 200.

The display substrate 100 may include elements and circuits for displaying an image, for example, pixel circuits such as switching elements, and conductive patterns to be described later and self-light emitting elements disposed in the display area DPA. The self-light emitting element may include at least one of an organic light emitting diode, a quantum dot light emitting diode, an inorganic material-based micro light emitting diode (e.g., a micro LED), and an inorganic material-based nano light emitting diode (e.g., a nano LED). Hereinafter, for convenience of explanation, a case where the self-light emitting element is an organic light emitting element will be described by way of example.

The counter substrate 200 may be positioned on the display substrate 100 and may face the display substrate 100. In an exemplary embodiment, the counter substrate 200 may be a color conversion substrate converting a color of incident light. The counter substrate 200 may be made of transparent glass, plastic, or the like, and may be rigid or flexible.

The sealing part 250 may be disposed between the display substrate 100 and the counter substrate 200 in the non-display area NDA. The sealing part 250 may be disposed along edges of the display substrate 100 and the counter substrate 200 in the non-display area NDA to surround the display area DPA in plan view. The display substrate 100 and the counter substrate 200 may be coupled to each other through the sealing part 250. In an exemplary embodiment, the sealing part 250 may be made of an inorganic or organic material. For example, the sealing part 250 may be made of an inorganic material such as frit or an organic material such as an epoxy-based resin, but is not limited thereto.

The filler 300 may be disposed in a space between the display substrate 100 and the counter substrate 200 surrounded by the sealing part 250. The filler 300 may fill the space between the display substrate 100 and the counter substrate 200.

In an exemplary embodiment, the filler 300 may be made of a material that may transmit light. In an exemplary embodiment, the filler 300 may be made of an organic material. For example, the filler 300 may be made of a silicon-based organic material, an epoxy-based organic material, or the like, but is not limited thereto. In another exemplary embodiment, the filler 300 may also be omitted.

Figure 3:
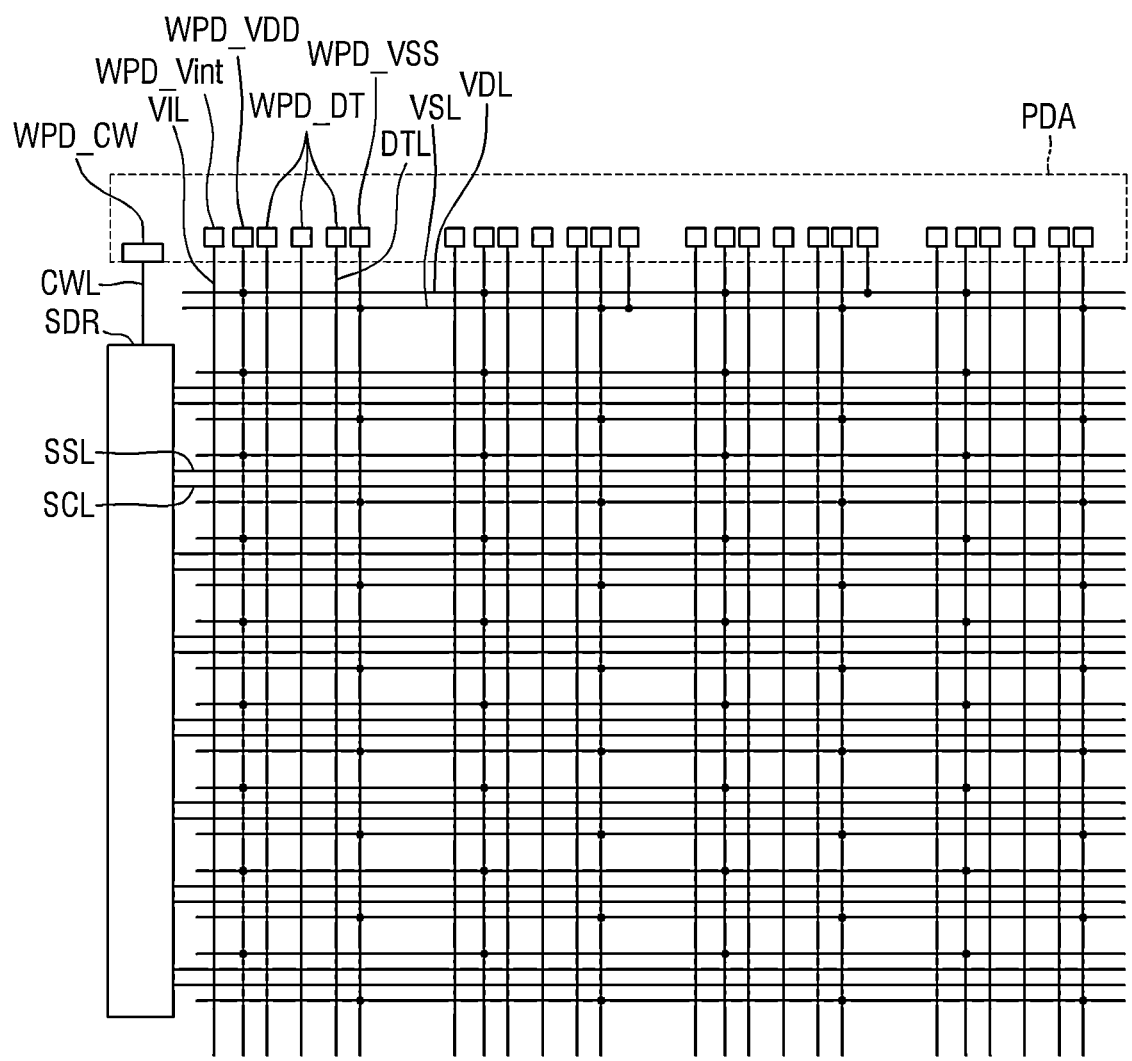
FIG. 3 is a schematic layout diagram illustrating lines included in the display device according to an exemplary embodiment.

FIG. 3 is a schematic layout diagram illustrating lines included in the display device according to an exemplary embodiment.

Referring to FIG. 3, the display device 10 may include a plurality of lines. The plurality of lines may include scan lines SCL, sensing lines SSL, data lines DTL, initialization voltage lines VIL, first voltage lines VDL, and second voltage lines VSL. In addition, although not illustrated in FIG. 3, other lines may be further disposed in the display device 10.

The scan lines SCL and the sensing lines SSL may extend in the first direction DR1. The scan lines SCL and the sensing lines SSL may be connected to a scan driver SDR. The scan driver SDR may include a driving circuit. The scan driver SDR may be disposed on one side of the display area DPA in the first direction DR1, but is not limited thereto. The scan driver SDR may be connected to a signal line pattern CWL, and at least one end of the signal line pattern CWL may be connected to an external device by forming a pad WPD_CW on the non-display area NDA.

Meanwhile, in the present specification, the term 'connection' may not only mean that any one member is connected to another member through physical contact with another member, but may also mean that any one member is connected to another member through the other member. In addition, it may be understood that any one portion and another portion as one integrated member are interconnected due to the integrated member. Furthermore, a connection between any one member and another member may be interpreted as the meaning including an electrical connection through the other member in addition to a connection through direct contact therebetween.

The data lines DTL and the initialization voltage lines VIL may extend in the second direction DR2 crossing the first direction DR1. The first voltage lines VDL and the second voltage lines VSL are disposed to extend in the first direction DR1 and the second direction DR2. Portions of the first voltage lines VDL and the second voltage lines VSL extending in the first direction DR1 and portions of the first voltage lines VDL and the second voltage lines VSL extending in the second direction DR2 may be formed of conductive layers disposed on different layers, and the first voltage lines VDL and the second voltage lines VSL may have a mesh structure on the entire surface of the display area DPA. However, the present disclosure is not limited thereto. Each of pixels PX of the display device 10 may be connected to at least one data line DTL, initialization voltage line VIL, first voltage line VDL, and second voltage line VSL.

The data line DTL, the initialization voltage line VIL, the first voltage line VDL, and the second voltage line VSL may be electrically connected to at least one wiring pad WPD. Each wiring pad WPD may be disposed in the non-display area NDA. In an exemplary embodiment, wiring pads WPD_DT (hereinafter, referred to as 'data pads') of the data lines DTL, wiring pads WPD_Vint (hereinafter, referred to as 'initialization voltage pads') of the initialization voltage lines VIL, wiring pads WPD_VDD (hereinafter, referred to as 'first power pads') of the first voltage lines VDL, and wiring pads WPD_VSS (hereinafter, referred to as 'second power pads') of the second voltage lines VSL may be disposed in a pad area PDA on one side of the display area DPA in the second direction DR2. An external device may be mounted on the wiring pad WPD. The external device may be mounted on the wiring pad WPD through an anisotropic conductive film, ultrasonic bonding, or the like.

Each pixel PX or sub-pixel SPXn (n is an integer of 1 to 3) of the display device 10 includes a pixel driving circuit. The above-described lines may apply driving signals to the respective pixel driving circuits while passing through the respective pixels PX or around the respective pixels PX. The pixel driving circuit may include a transistor and a capacitor. The numbers of transistors and capacitors in each pixel driving circuit may be variously modified. According to an exemplary embodiment, each sub-pixel SPXn of the display device 10 may have a 3T1C structure in which the pixel driving circuit includes three transistors and one capacitor. Hereinafter, the pixel driving circuit will be described using the 3T1C structure as an example, but the present disclosure is not limited thereto, and various other modified pixel PX structures such as a 2T1C structure, a 7T1C structure, and a 6T1C structure may also be applied.

Figure 4:
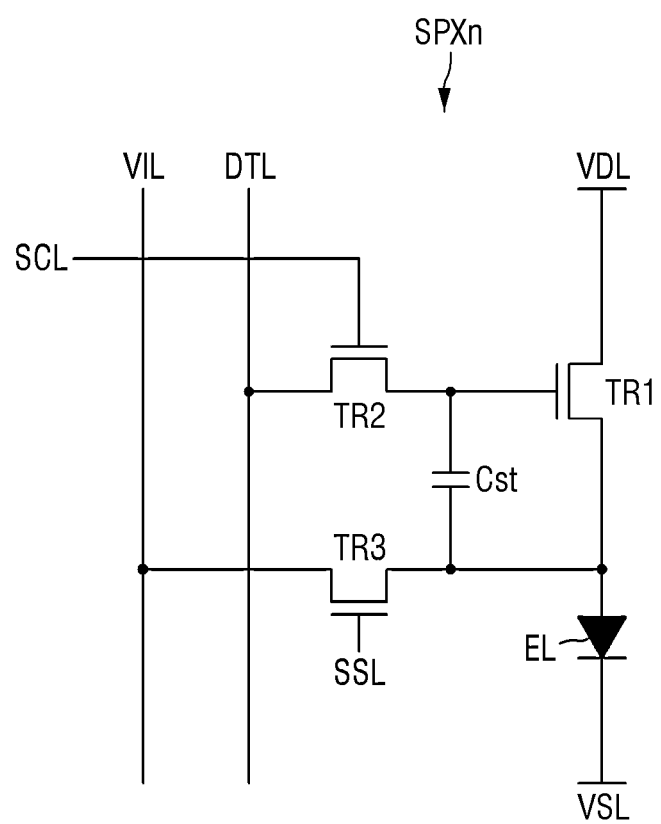
FIG. 4 is an equivalent circuit diagram of one sub-pixel according to an exemplary embodiment.

FIG. 4 is an equivalent circuit diagram of one sub-pixel according to an exemplary embodiment.

Referring to FIG. 4, each sub-pixel SPXn of the display device 10 according to an exemplary embodiment includes three transistors TR1, TR2, and TR3 and one storage capacitor Cst, in addition to a light emitting diode EL.

The light emitting diode EL emits light according to a current supplied through a first transistor TR1. The light emitting diode EL includes a first electrode, a second electrode, and at least one light emitting element disposed between the first electrode and the second electrode. The light emitting element may emit light of a specific wavelength band by electrical signals transferred from the first electrode and the second electrode.

One end of the light emitting diode EL is connected to a source electrode of the first transistor TR1, and the other end of the light emitting diode EL may be connected to the second voltage line VSL to which a low potential voltage (hereinafter, referred to as a second source voltage) lower than a high potential voltage (hereinafter, referred to as a first source voltage) of the first voltage line VDL is supplied. In addition, the other end of the light emitting diode EL may be electrically connected to a source electrode of a second transistor TR2.

The first transistor TR1 adjusts a current flowing from the first voltage line VDL to which the first source voltage is supplied to the light emitting diode EL according to a voltage difference between a gate electrode and the source electrode thereof. As an example, the first transistor TR1 may be a driving transistor for driving the light emitting diode EL. The gate electrode of the first transistor TR1 may be connected to a source electrode of the second transistor TR2, the source electrode of the first transistor TR1 may be connected to the first electrode of the light emitting diode EL, and a drain electrode of the first transistor TR1 may be connected to the first voltage line VDL to which the first source voltage is applied.

The second transistor TR2 is turned on by a scan signal of the scan line SCL to connect the data line DTL to the gate electrode of the first transistor TR1. A gate electrode of the second transistor TR2 may be connected to the scan line SCL, the source electrode of the second transistor TR2 may be connected to the gate electrode of the first transistor TR1, and a drain electrode of the second transistor TR2 may be connected to the data line DTL.

A third transistor TR3 is turned on by a sensing signal of the sensing line SSL to connect the initialization voltage line VIL to one end of the light emitting diode EL. A gate electrode of the third transistor TR3 is connected to the sensing line SSL, a drain electrode of the third transistor TR3 may be connected to the initialization voltage line VIL, and a source electrode of the third transistor TR3 may be connected to one end of the light emitting diode EL or the source electrode of the first transistor TR1.

In an exemplary embodiment, the source electrode and the drain electrode of each of the transistors TR1, TR2, and TR3 are not limited to those described above, and vice versa. In addition, each of the transistors TR1, TR2, and TR3 may be formed as a thin film transistor. In addition, it has been mainly described in FIG. 3 that each of the transistors TR1, TR2, and TR3 is formed as an N-type metal oxide semiconductor field effect transistor (MOSFET), but the present disclosure is not limited thereto. That is, each of the transistors TR1, TR2, and TR3 may be formed as a P-type MOSFET or some of the transistors TR1, TR2, and TR3 may be formed as an N-type MOSFET and the others of the transistors TR1, TR2, and TR3 may be formed as a P-type MOSFET.

The storage capacitor Cst is formed between the gate electrode and the source electrode of the first transistor TR1. The storage capacitor Cst stores a difference voltage between a gate voltage and a source voltage of the first transistor TR1.

Hereinafter, a structure of one sub-pixel SPX of the display device 10 according to an exemplary embodiment will be described in detail with reference to other drawings.

Figure 5:
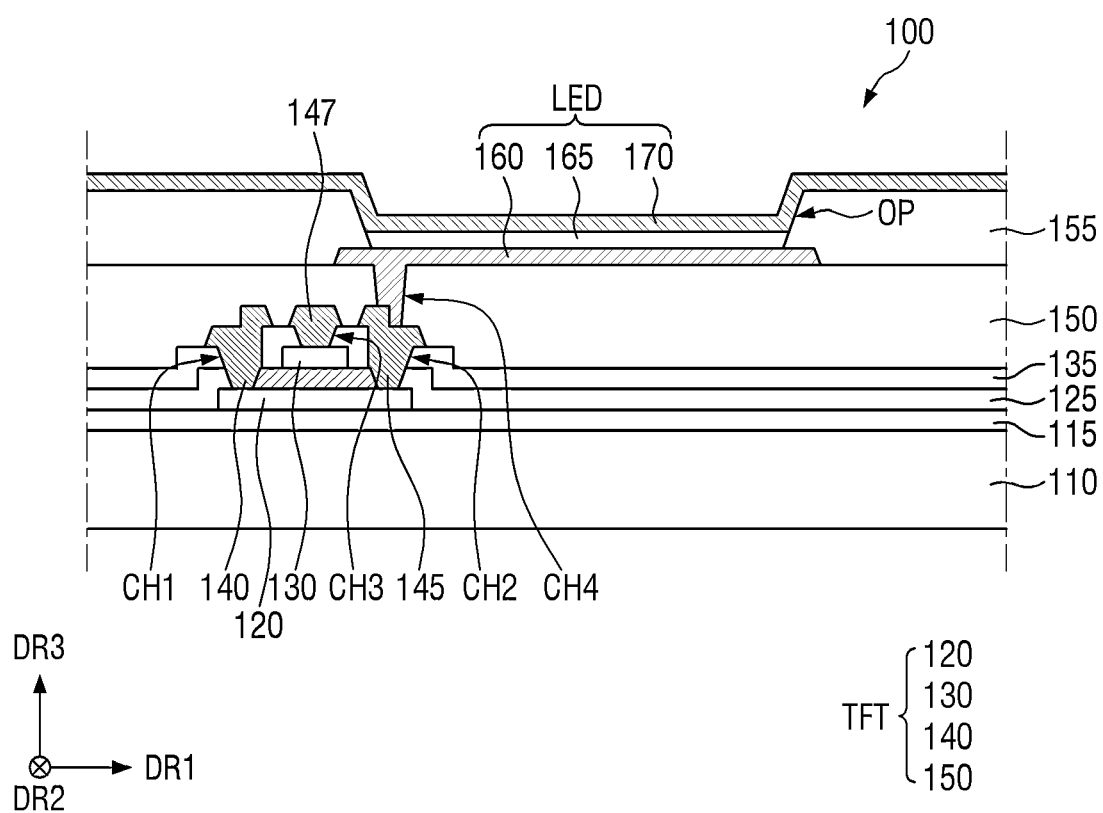
FIG. 5 is a schematic cross-sectional view illustrating one sub-pixel of the display device according to an exemplary embodiment.

FIG. 5 is a schematic cross-sectional view illustrating one sub-pixel of the display device according to an exemplary embodiment. A structure of the above-described display substrate 100 will be described in detail with reference to FIG. 5.

Referring to FIG. 5, the display substrate 100 of the display device 10 according to an exemplary embodiment may include a substrate 110. The substrate 110 may be a base substrate or a base member, and may be made of a transparent insulating material. For example, the substrate 110 may include glass or a polymer material. When the substrate 110 includes the glass, the substrate 110 may be a rigid substrate, and when the substrate 110 includes the polymer material, the substrate 110 may be flexible substrate that may be bent, folded, or rolled. In the present exemplary embodiment, it will be described by way of example that the substrate 110 is the rigid substrate including the glass. However, the present disclosure is not limited thereto, and the substrate 110 may be a flexible substrate including polyimide (PI).

A buffer layer 115 may be disposed on the substrate 110. The buffer layer 115 may be formed as an inorganic film capable of preventing permeation of air or moisture. The buffer layer 115 may include a silicon compound, metal oxide, or the like. For example, the buffer layer 115 may include silicon oxide, silicon nitride, silicon oxynitride, aluminum oxide, tantalum oxide, hafnium oxide, zirconium oxide, titanium oxide, or the like. These materials may be used alone or in combination with each other. The buffer layer 115 may be a single film or a multilayer film including stacked films made of different materials.

A transistor TFT may be disposed on the buffer layer 115. The transistor TFT may include a semiconductor layer 120, a gate electrode 130, a source electrode 140, and a drain electrode 145. The transistor TFT may constitute a pixel circuit of each of the plurality of pixels. For example, the transistor TFT may be a driving transistor or a switching transistor of the pixel circuit. It has been illustrated in FIG. 5 that one transistor TFT is disposed in the sub-pixel SPX of the display device 10, but the present disclosure is not limited thereto, and the display device 10 may include a larger number of transistors.

The semiconductor layer 120 may be disposed on the buffer layer 115. The semiconductor layer 120 may be disposed to partially overlap a gate electrode 130 or the like of a first conductive layer to be described later.

The semiconductor layer 120 may include polycrystalline silicon, single crystal silicon, an oxide semiconductor, or the like. In another exemplary embodiment, the semiconductor layer 120 may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin Oxide (IZTO), indium gallium tin oxide (IGTO), indium gallium zinc oxide (IGZO), and indium gallium zinc tin oxide (IGZTO).

A gate insulating layer 125 may be disposed on the semiconductor layer 120. The gate insulating layer 125 may be disposed on the substrate 110 including the semiconductor layer 120. The gate insulating layer 125 may serve as a gate insulating film of the transistor TFT. The gate insulating layer 125 may include a silicon compound, a metal oxide, or the like. For example, the gate insulating layer 125 may include silicon oxide, silicon nitride, silicon oxynitride, aluminum oxide, tantalum oxide, hafnium oxide, zirconium oxide, titanium oxide, or the like. These materials may be used alone or in combination with each other. The gate insulating layer 125 may be a single film or a multilayer film including stacked films made of different materials.

The gate electrode 130 may be disposed on the gate insulating layer 125. The gate electrode 130 may be disposed to overlap a channel region of the semiconductor layer 120 in the third direction DR3, which is a thickness direction. The gate electrode 130 may include a conductive layer, a first capping layer disposed on the conductive layer, and a second capping layer disposed on the first capping layer. A description thereof will be provided later.

An interlayer insulating layer 135 may be disposed on the gate electrode 130. The interlayer insulating layer 135 may be disposed on the gate electrode 130 and the gate insulating layer 125. The interlayer insulating layer 135 may function as an insulating film between the gate electrode 130 and other layers disposed thereon. In addition, the interlayer insulating layer 135 may be disposed to cover the gate electrode 130 to serve to protect the gate electrode 130.

The interlayer insulating layer 135 may include a silicon compound, a metal oxide, or the like. For example, the interlayer insulating layer 135 may include silicon oxide, silicon nitride, silicon oxynitride, aluminum oxide, tantalum oxide, hafnium oxide, zirconium oxide, titanium oxide, or the like. These materials may be used alone or in combination with each other. The interlayer insulating layer 135 may be a single film or a multilayer film including stacked films made of different materials.

The source electrode 140 and the drain electrode 145 may be disposed on the interlayer insulating layer 135. The source electrode 140 may be connected to the semiconductor layer 120 through a first contact hole CH1 penetrating through the interlayer insulating layer 135 and the gate insulating layer 125. The drain electrode 145 may be connected to the semiconductor layer 120 through a second contact hole CH2 penetrating through the interlayer insulating layer 135 and the gate insulating layer 125.

A connection electrode 147 may be disposed between the source electrode 140 and the drain electrode 145. The connection electrode 147 may serve to connect a circuit connected to the transistor TFT and the gate electrode 130 to each other. The connection electrode 147 may be connected to the gate electrode 130 through a third contact hole CH3 penetrating through the interlayer insulating layer 135.

Each of the source electrode 140, the drain electrode 145, and the connection electrode 147 may include one or more metals selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The source electrode 140, the drain electrode 145, and the connection electrode 147 may be a single film or a multilayer film.

A via layer 150 may be disposed on the source electrode 140, the drain electrode 145, and the connection electrode 147. The via layer 150 may improve film formability of a first electrode 160 formed thereon by planarizing a step therebelow.

The via layer 150 may include an inorganic insulating material or an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). The via layer 150 may be a single film or a multilayer film including stacked films made of different materials.

An organic light emitting element LED may be disposed on the via layer 150. The organic light emitting element LED may include the first electrode 160, a light emitting layer 165, and a second electrode 170.

The first electrode 160 may be disposed on the via layer 150. The first electrode 160 may be disposed in a pattern shape in each sub-pixel SPX. The first electrode 160 may be an anode electrode of the organic light emitting element LED. The first electrode 160 may be connected to the drain electrode 145 of the transistor TFT through a fourth contact hole CH4 penetrating through the via layer 150.

The first electrode 160 may include a transparent conductive material. For example, the first electrode 160 may include a material such as indium tin oxide (ITO), indium zinc oxide (IZO), or indium tin zinc oxide (ITZO). In some exemplary embodiments, the first electrode 160 may have a structure in which one or more layers made of a transparent conductive material and one or more layers made of a metal having high reflectivity are stacked or may be formed as one layer including the transparent conductive material and the metal having the high reflectivity. For example, the first electrode 160 may have a stacked structure such as ITO/Ag/ITO, ITO/Ag/IZO, or ITO/Ag/ITZO/IZO.

A bank layer 155 may be disposed on the first electrode 160. The bank layer 155 may include an opening OP partially exposing the first electrode 160. The bank layer 155 may be formed of an organic insulating material or an inorganic insulating material. For example, the bank layer 155 may include at least one of a photoresist, a polyimides resin, an acrylates resin, a silicone compound, and a polyacrylates resin.

The light emitting layer 165 may be disposed on the first electrode 160. The light emitting layer 165 may include at least one of a hole injection layer, a hole transport layer, an electron transport layer, and an electron injection layer. The light emitting layer 165 may emit red, blue, and green light or emit white light for each sub-pixel SPX. When the light emitting layer 165 emits the white light, red, blue, and green colors may be each implemented through wavelength conversion members.

The second electrode 170 may be disposed on the light emitting layer 165 and the bank layer 155. The second electrode 170 may be entirely disposed on the display area of the substrate 110. The second electrode 170 may be a common electrode disposed over a plurality of sub-pixels. The second electrode 170 may be a cathode electrode of the organic light emitting element LED.

Meanwhile, the above-described gate electrode 130 is a conductive pattern, and may have a structure in which a conductive layer, a first capping layer, and a second capping layer are stacked. A gate electrode 130 described below is not limited to the gate electrode 130, and may be applied to various conductive patterns such as a line such as a scan line SCL (see FIG. 3) formed simultaneously with the gate electrode 130, and an electrode of a capacitor.

Figure 6:
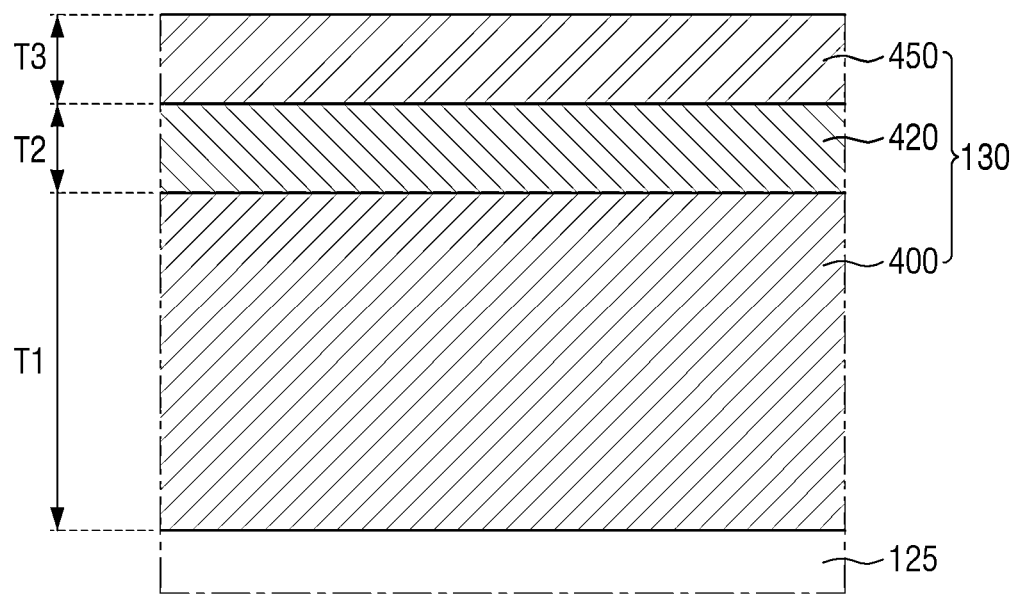
FIG. 6 is a schematic cross-sectional view illustrating a gate electrode according to an exemplary embodiment.
Figure 7:
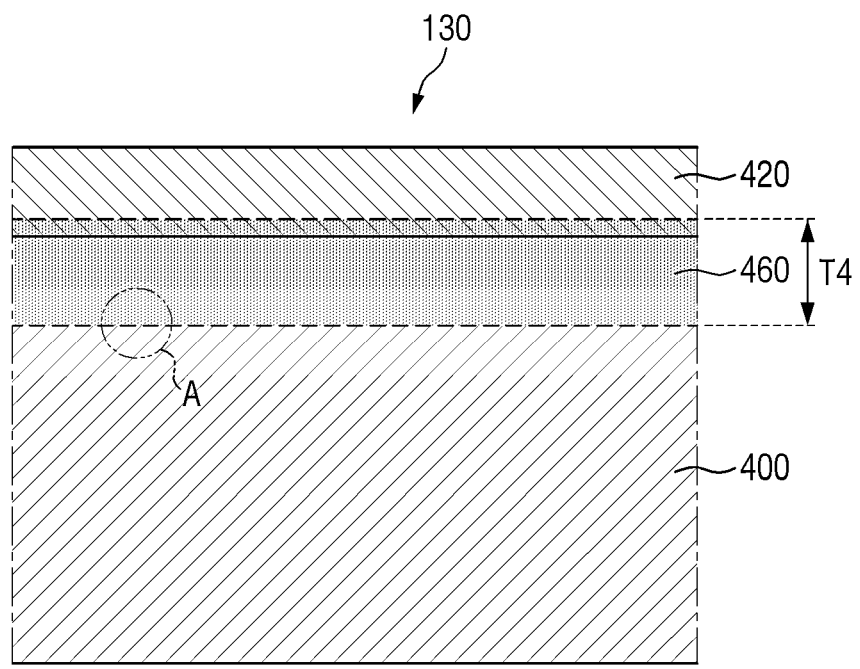
FIG. 7 is a schematic cross-sectional view illustrating a portion of the gate electrode according to an exemplary embodiment.
Figure 8:
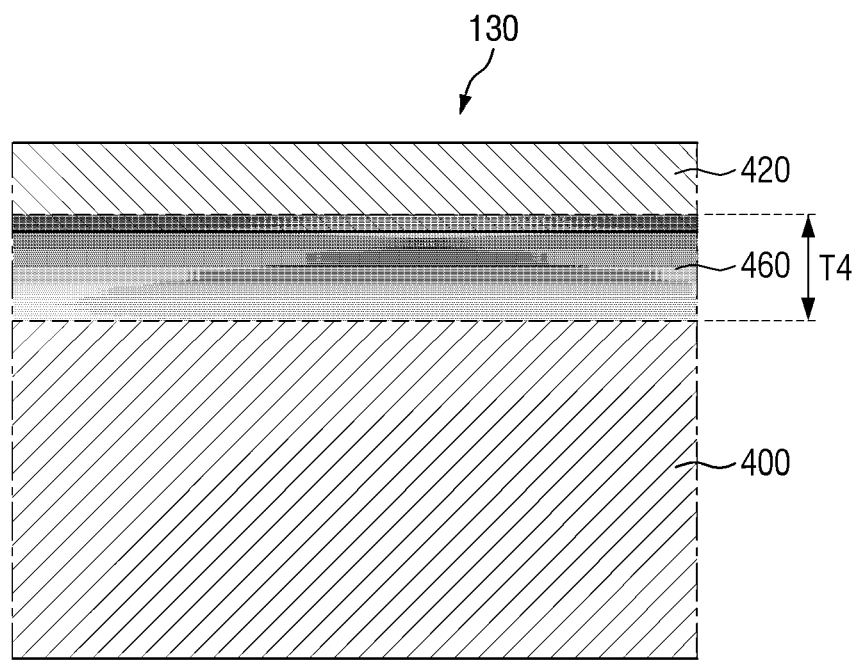
FIG. 8 is a schematic cross-sectional view illustrating a portion of the gate electrode according to an exemplary embodiment.
Figure 9:
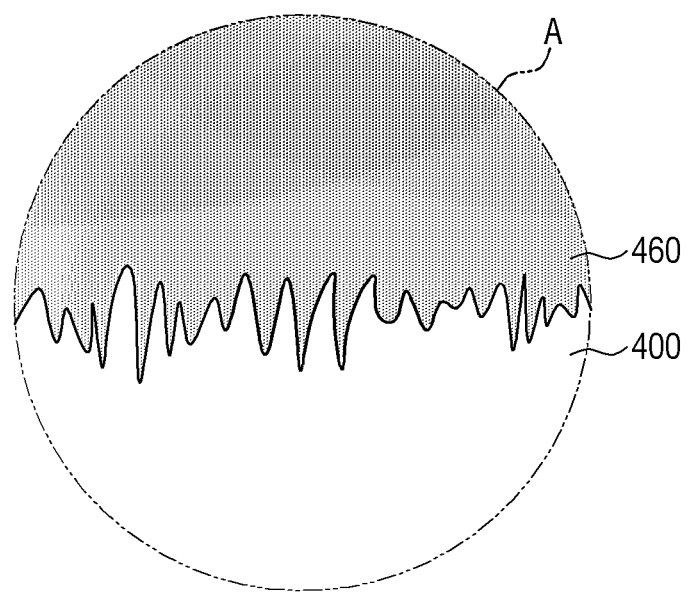
FIG. 9 is an enlarged cross-sectional view of region A of FIG. 7.

FIG. 6 is a schematic cross-sectional view illustrating a gate electrode according to an exemplary embodiment. FIG. 7 is a schematic cross-sectional view illustrating a portion of the gate electrode according to an exemplary embodiment. FIG. 8 is a schematic cross-sectional view illustrating a portion of the gate electrode according to an exemplary embodiment. FIG. 9 is an enlarged cross-sectional view of region A of FIG. 7.

Referring to FIGS. 6 to 9, the gate electrode 130 according to an exemplary embodiment may include a conductive layer 400, a first capping layer 420 disposed on the conductive layer 400, and a second capping layer 450 disposed on the first capping layer 420.

The conductive layer 400 may serve to decrease a resistance by imparting substantial conductivity to the gate electrode 130. The conductive layer 400 may be made of a material having excellent conductive characteristics, and may include, for example, an aluminum alloy. In an exemplary embodiment, the aluminum alloy may include aluminum and other additive materials. The additive materials may include one or more selected from the group consisting of nickel (Ni), lanthanum (La), titanium (Ti), and neodymium (Nd), but are not limited thereto. In an exemplary embodiment, the aluminum alloy may include any one or two or more selected from the group consisting of nickel (Ni), lanthanum (La), titanium (Ti), and neodymium (Nd).

In one exemplary embodiment, the additive materials of the aluminum alloy may be included in the range of about 0.1 at % to about 1 at % based on a total aluminum alloy. In an exemplary embodiment, when the additive material is nickel alone, the nickel may be included in about 0.2 at % based on the total aluminum alloy. In another exemplary embodiment, when the additive materials are nickel, lanthanum, and titanium, the nickel, the lanthanum, and the titanium may be included in about 0.02 at %, about 0.04 at %, and about 0.06 at % based on the total aluminum alloy, respectively. However, the present disclosure is not limited thereto.

When the additive materials of the aluminum alloy are included in the range of about 0.1 at % to 1 at % based on the total aluminum alloy, the additive materials may increase heat resistance of the gate electrode 130. In addition, the aluminum alloy includes the additive materials in a content of 1 at % or less, such that an increase in resistance of the gate electrode 130 may be prevented.

The conductive layer 400 may be formed to have a predetermined thickness in consideration of the conductive characteristics of the gate electrode 130. In an exemplary embodiment, a thickness T1 of the conductive layer 400 may be 1500 to 4000 Å. Here, when the thickness T1 of the conductive layer 400 is 1500 Å or more, conductivity of the gate electrode 130 may be increased, and when the thickness T1 of the conductive layer 400 is 4000 Å or less, it is possible to prevent a subsequent process from being difficult due to a step of the gate electrode 130.

The first capping layer 420 may be disposed on the conductive layer 400. The first capping layer 420 may serve to protect the conductive layer 400, on the conductive layer 400. When the conductive layer 400 includes aluminum, the aluminum of the conductive layer 400 disposed below the sealing part 250 may be lost due to high heat of laser at the time of hardening the sealing part 250 by the laser. The first capping layer 420 may serve to prevent loss of the conductive layer 400 described above.

The first capping layer 420 may include titanium (Ti). The titanium may have heat resistance more excellent than that of aluminum to protect the conductive layer 400 from the high heat of the laser.

The first capping layer 420 may be formed to have a predetermined thickness in order to protect the conductive layer 400. In an exemplary embodiment, a thickness T2 of the first capping layer 420 may be 50 to 300 Å. Here, when the thickness T2 of the first capping layer 420 is 50 Å or more, loss of the conductive layer 400 may be prevented, and when the thickness T2 of the first capping layer 420 is 300 Å or less, it is possible to prevent a subsequent process from being difficult due to a step owing to an increase in the entire thickness of the gate electrode 130.

As illustrated in FIG. 7, the titanium of the first capping layer 420 may be diffused at an interface of the conductive layer 400 by a subsequent heat treatment process. In an exemplary embodiment, the titanium of the first capping layer 420 may be diffused into the conductive layer 400. In addition, the aluminum of the conductive layer 400 may be diffused into the first capping layer 420. Accordingly, a mixed region 460 in which the aluminum and the titanium are mixed with each other may be formed in a lower region of the first capping layer 420 adjacent to the conductive layer 400 and an upper region of the conductive layer 400 adjacent to the first capping layer 420.

The mixed region 460 is a region in which the aluminum and the titanium coexist, and may include titanium-aluminum alloys (TiAlx) by a combination of the aluminum and the titanium. That is, the mixed region 460 may be defined as a region in which the titanium-aluminum alloys exist. The titanium-aluminum alloys have excellent heat resistance characteristics. Accordingly, the mixed region 460 including the titanium-aluminum alloys may be disposed in the upper region of the conductive layer 400 and/or on the conductive layer 400 to prevent the aluminum of the conductive layer 400 disposed below the sealing part 250 from being lost due to the high heat of the laser at the time of hardening the sealing part 250 by the laser.

The mixed region 460 may include three bonding types of titanium-aluminum alloys (TiAlx). The titanium-aluminum alloys may include three bonding types such as $TiAl_3$, $TiAl_2$, and TiAl. As described above, the titanium of the first capping layer 420 may be diffused into the conductive layer 400. As illustrated in FIG. 8, a content of titanium may gradually decrease toward a lower surface of the conductive layer 400 in the mixed region 460. A content of titanium in an upper region of the mixed region 460 adjacent to the second capping layer 450, that is, a region of the mixed region 460 corresponding to the first capping layer 420 may be high, such that a large amount of TiAl$_3$ alloys may be distributed in the upper region of the mixed region 460. A distribution of titanium decreases toward the lower surface of the conductive layer 400 in the mixed region 460. Accordingly, as a region is adjacent to the lower surface of the conductive layer 400 in the mixed region 460, a distribution of TiAl$_3$ alloys decreases and a distribution of TiAl$_2$ alloys increases, and as a region is more adjacent to the lower surface of the conductive layer 400 in the mixed region 460, a distribution of TiAl$_2$ alloys decreases and a distribution of TiAl alloys increases. In an exemplary embodiment, the mixed region 460 may exhibit a distribution tendency in which TiAl$_3$, TiAl$_2$, and TiAl are distributed toward the lower surface of the conductive layer 400.

In an exemplary embodiment, the mixed region 460 may be formed to have a predetermined thickness according to a diffusion degree of the titanium and the aluminum. In an exemplary embodiment, a thickness T4 of the mixed region 460 may be 100 to 600 Å. When the thickness T4 of the mixed region 460 is 100 Å or more, loss of the aluminum in the conductive layer 400 may be prevented, and when the thickness T4 of the mixed region 460 is 600 Å or less, a decrease in resistance of the conductive layer 400 may be prevented.

Referring to FIG. 9, a lower surface of the mixed region 460 may have an uneven structure. When the titanium of the first capping layer 420 is diffused into the aluminum of the conductive layer 400, the titanium is diffused into a grain boundary of the aluminum. Accordingly, the lower surface of the mixed region 460 may have a rugged uneven structure. However, the lower surface of the mixed region 460 is not limited to the shape illustrated in FIG. 9, and may have a random uneven structure.

Meanwhile, a second capping layer 450 may be disposed on the first capping layer 420. The second capping layer 450 may protect the conductive layer 400 disposed below the first capping layer 420, on the first capping layer 420. When the conductive layer 400 includes the aluminum, a hillock may occur on a surface of the conductive layer 400 in a subsequent high-temperature heat treatment process. In addition, when the interlayer insulating layer 135 is formed on an aluminum layer and the third contact hole CH3 exposing the aluminum layer is formed, fluoride may be formed on a surface of the aluminum layer. In this case, the aluminum layer may be eroded by a cleaning liquid for removing the fluoride, for example, a cleaning liquid such as a buffer oxide etchant (BOE). The second capping layer 450 may serve to prevent the hillock and the erosion of the conductive layer 400.

The second capping layer 450 may include titanium nitride (TiN). The titanium nitride (TiN) is a material having high resistance to the cleaning liquid such as the BOE, and may prevent the erosion of the conductive layer 400. An atomic ratio (number of nitrogen atoms/number of titanium atoms) of nitrogen (N) to titanium (Ti) included in the second capping layer 450 may be 0.8 or more. In an exemplary embodiment, when the atomic ratio of the nitrogen to the titanium is 0.8 or more, the conductive layer 400 may be protected from the cleaning liquid.

The second capping layer 450 may be formed to have a predetermined thickness in order to protect the conductive layer 400 and the first capping layer 420 disposed therebelow. In an exemplary embodiment, a thickness T3 of the second capping layer 450 may be 500 to 1000 Å. When the thickness T3 of the second capping layer 450 is 500 Å or more, the hillock and the erosion of the aluminum of the conductive layer 400 may be prevented, and the first capping layer 420 disposed below the second capping layer 450 may be protected at the time of etching the third contact hole CH3. In addition, when the thickness T3 of the second capping layer 450 is 1000 Å or less, an increase in step due to an increase in entire thickness of the gate electrode 130 may be prevented.

As described above, in an exemplary embodiment, by forming the first capping layer 420 on the conductive layer 400 to form the mixed region including the titanium-aluminum alloys, it is possible to prevent the conductive layer 400 from being lost due to the high heat of the laser.

In addition, in an exemplary embodiment, by forming the second capping layer 450 on the first capping layer 420, it is possible to prevent the hillock from occurring on the surface of the conductive layer 400 and it is possible to prevent the conductive layer 400 from being eroded by the cleaning liquid.

Hereinafter, a structure of a gate electrode of a display device according to another exemplary embodiment will be described with reference to other drawings.

Figure 10:
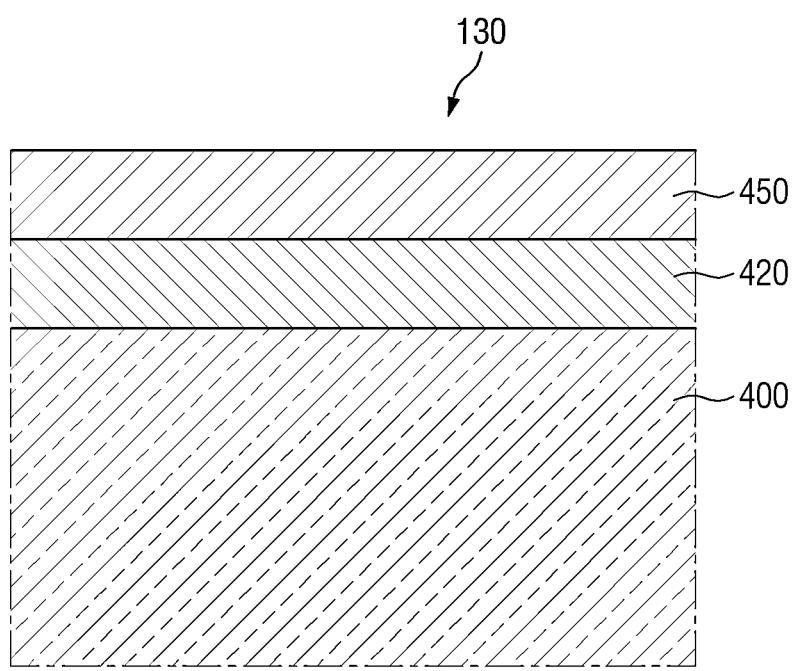
FIG. 10 is a schematic cross-sectional view illustrating a gate electrode of a display device according to another exemplary embodiment.

FIG. 10 is a schematic cross-sectional view illustrating a gate electrode of a display device according to another exemplary embodiment.

Referring to FIG. 10, the present exemplary embodiment is different from the exemplary embodiment described above with reference to FIGS. 6 to 9 in that a conductive layer 400 includes aluminum alone. Hereinafter, a description of the same components as those of the exemplary embodiment described above will be omitted, and contents different from those of the exemplary embodiment described above will be described in detail.

In another exemplary embodiment, the conductive layer 400 of the gate electrode 130 may be made of aluminum alone, that is, pure aluminum. When the conductive layer 400 is made of the aluminum alone, conductivity may be more excellent than that of the aluminum alloy. In addition, the conductive layer 400 may be easily manufactured and productivity may be increased.

Figure 11:
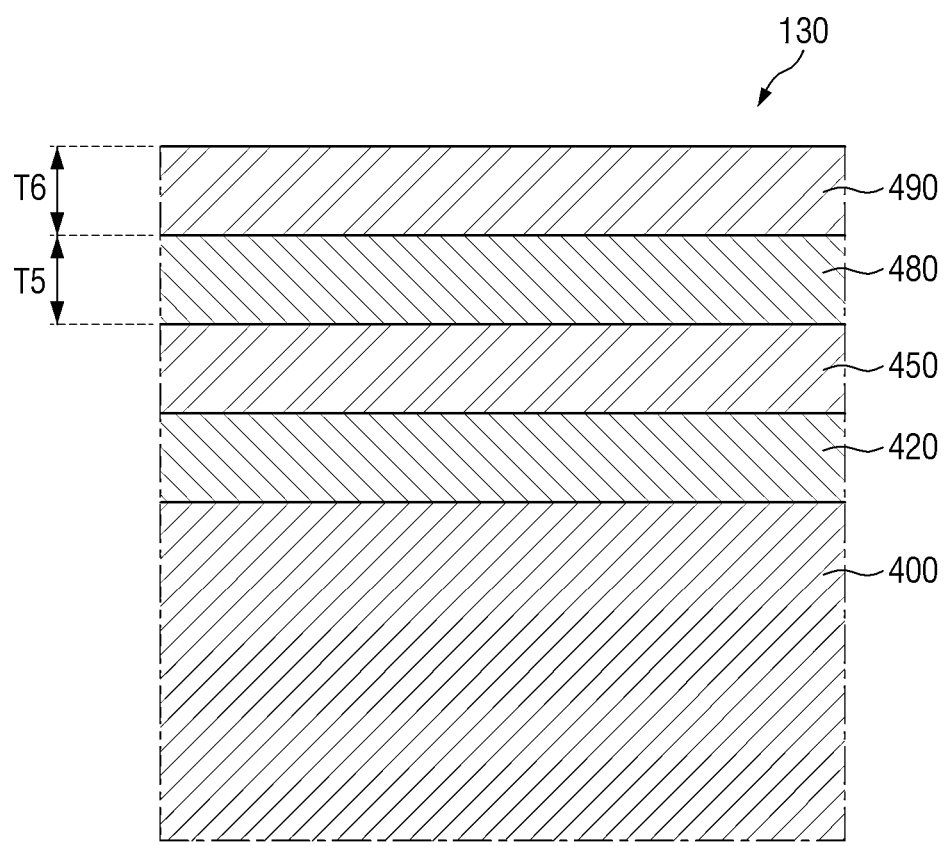
FIG. 11 is a schematic cross-sectional view illustrating a gate electrode of a display device according to still another exemplary embodiment.

FIG. 11 is a schematic cross-sectional view illustrating a gate electrode of a display device according to still another exemplary embodiment.

Referring to FIG. 11, the present exemplary embodiment is different from the exemplary embodiments described above with reference to FIGS. 6 to 10 in that a gate electrode 130 further includes a third capping layer 480 and a fourth capping layer 490 disposed on the second capping layer 450. Hereinafter, a description of the same components as those of the exemplary embodiment described above will be omitted, and contents different from those of the exemplary embodiment described above will be described in detail.

In still another exemplary embodiment, the gate electrode 130 may include the third capping layer 480 disposed on the second capping layer 450 and the fourth capping layer 490 disposed on the third capping layer 480.

The third capping layer 480 may include the same material as the first capping layer 420. In still another exemplary embodiment, the third capping layer 480 may include titanium. The third capping layer 480 may serve to protect the conductive layer 400, the first capping layer 420, and the second capping layer 450 disposed therebelow, on the second capping layer 450.

The third capping layer 480 may include titanium (Ti). The titanium may have heat resistance more excellent than that of aluminum to protect the conductive layer 400 from the high heat of the laser. The third capping layer 480 may be formed to have a predetermined thickness in order to protect layers disposed therebelow. In still another exemplary embodiment, a thickness T5 of the third capping layer 480 may be 50 to 300 Å.

The fourth capping layer 490 may include the same material as the second capping layer 45. In still another exemplary embodiment, the fourth capping layer 490 may include titanium nitride (TiN). The fourth capping layer 490 may serve to protect the conductive layer 400, the first capping layer 420, the second capping layer 450, and the third capping layer 480 disposed therebelow, on the third capping layer 480.

The fourth capping layer 490 may include titanium nitride (TiN). The titanium nitride (TiN) is a material having high resistance to a cleaning liquid such as a BOE, and may prevent erosion of the conductive layer 400. An atomic ratio (number of nitrogen atoms/number of titanium atoms) of nitrogen (N) to titanium (Ti) included in the fourth capping layer 490 may be 0.8 or more.

As described above, the gate electrode 130 according to the present exemplary embodiment further includes the third capping layer 480 and the fourth capping layer 490 having the same configurations as the first capping layer 420 and the second capping layer 450, such that a defect of the conductive layer 400 may be further prevented.

However, the present disclosure is not limited thereto, and a plurality of capping layers having the same configurations as the third capping layer 480 and the fourth capping layer 490 may also be further stacked on the fourth capping layer 490.

Figure 12:
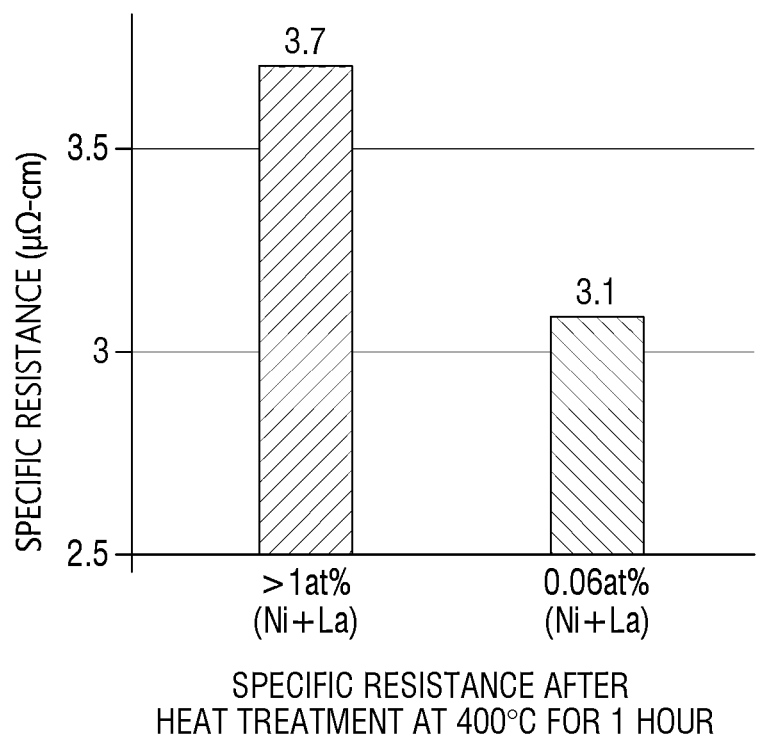
FIG. 12 is a graph illustrating a specific resistance of a conductive layer according to a content of additive materials of an aluminum alloy.

FIG. 12 is a graph illustrating a specific resistance of a conductive layer according to a content of additive materials of an aluminum alloy.

As in the exemplary embodiment described above, the conductive layer 400 of the gate electrode 130 may include the additive materials of the aluminum alloy in the range of 0.1 to 1 at %.

Referring to FIG. 12, in an aluminum alloy layer containing nickel and lanthanum as the additive materials, when a content of nickel and lanthanum exceeds 1 at % based on a total aluminum alloy layer, a specific resistance was about 3.7 μΩ·cm or more. On the other hand, when the content of nickel and lanthanum was 0.06 at % based on the total aluminum alloy layer, a specific resistance was about 3.1 μΩ·cm.

It could be seen through this result that when the conductive layer 400 includes the additive materials of the aluminum alloy in the range of 0.1 to 1 at %, it is possible to prevent an increase in resistance of the conductive layer 400.

Figure 13:
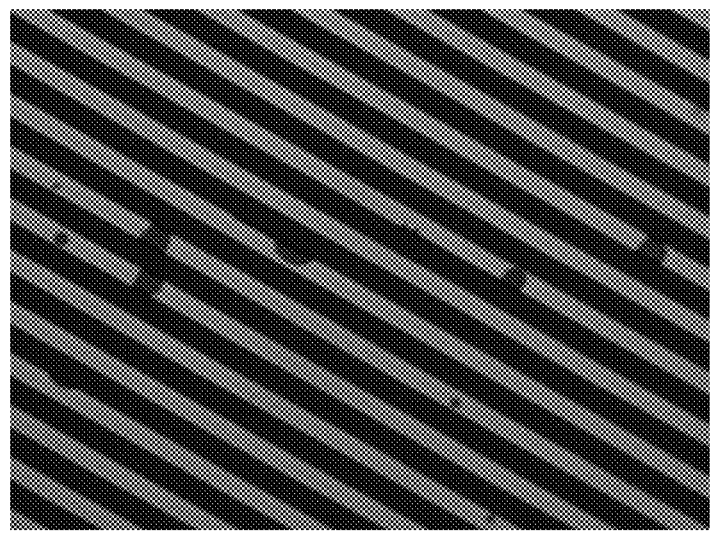
FIG. 13 is a surface image of a stacked film of aluminum and titanium nitride.
Figure 14:
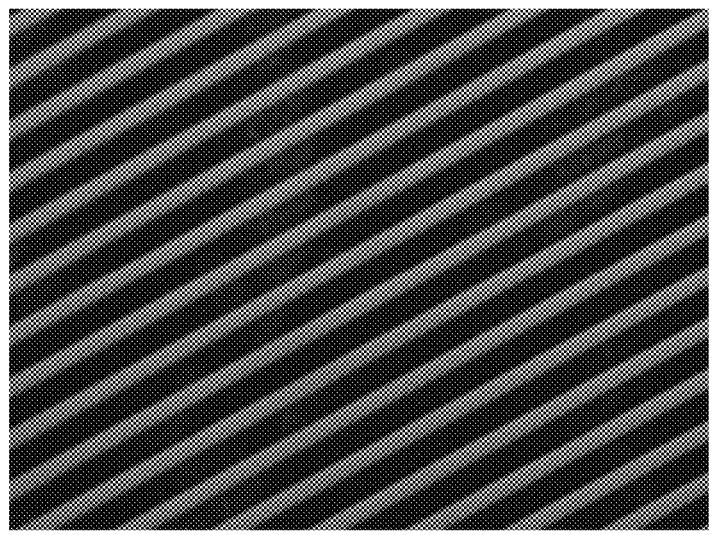
FIG. 14 is a surface image of a stacked film of aluminum and titanium.

FIG. 13 is a surface image of a stacked film of aluminum and titanium nitride. FIG. 14 is a surface image of a stacked film of aluminum and titanium.

As in the exemplary embodiment described above, the gate electrode 130 may have a structure in which the conductive layer 400 includes the aluminum and the first capping layer 420 includes the titanium.

Referring to FIG. 13, when looking at a surface image after stacking titanium nitride on an aluminum layer and irradiating a laser, damage expressed as black stains was observed in a plurality of regions.

On the other hand, referring to FIG. 14, when looking at a surface image after stacking titanium on an aluminum layer and irradiating a laser, black stains were not observed at all.

It might be confirmed that through this result that when the first capping layer 420 including the titanium is formed on the conductive layer 400 including the aluminum, TiAlx alloys may be formed between the conductive layer 400 and the first capping layer 420 due to the diffusion of the titanium to protect the conductive layer 400 from the high heat of the laser. On the other hand, it might be confirmed that when the first capping layer 420 includes titanium nitride, the titanium nitride is a very stable material, and thus, the diffusion of the titanium does not occur, such that the aluminum is partially lost due to the high heat of the laser.

Figure 15:
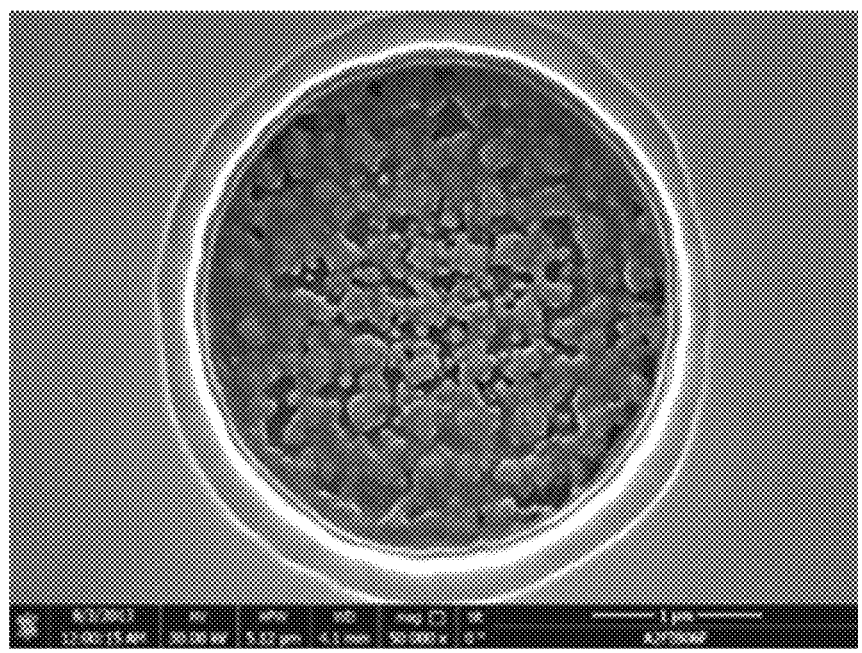
FIG. 15 is a surface image of a titanium layer.
Figure 16:
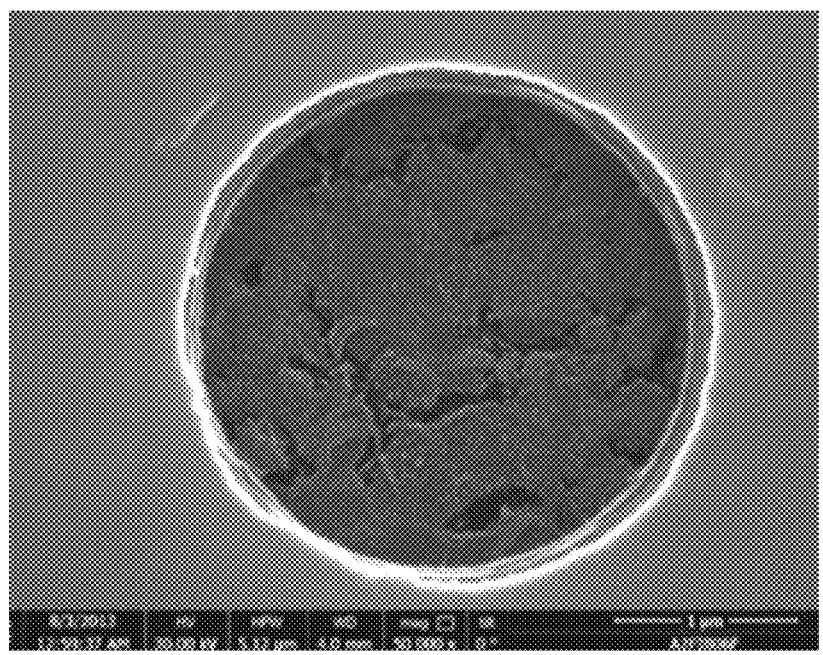
FIG. 16 is a surface image of a titanium nitride layer in which an atomic ratio of nitrogen to titanium is 0.5.
Figure 17:
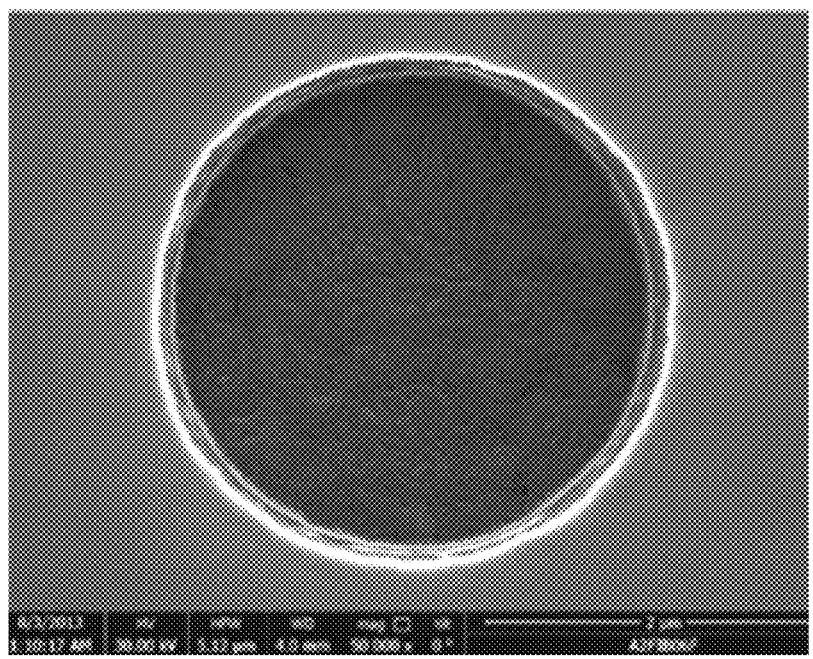
FIG. 17 is a surface image of a titanium nitride layer in which an atomic ratio of nitrogen to titanium is 0.8.
Figure 18:
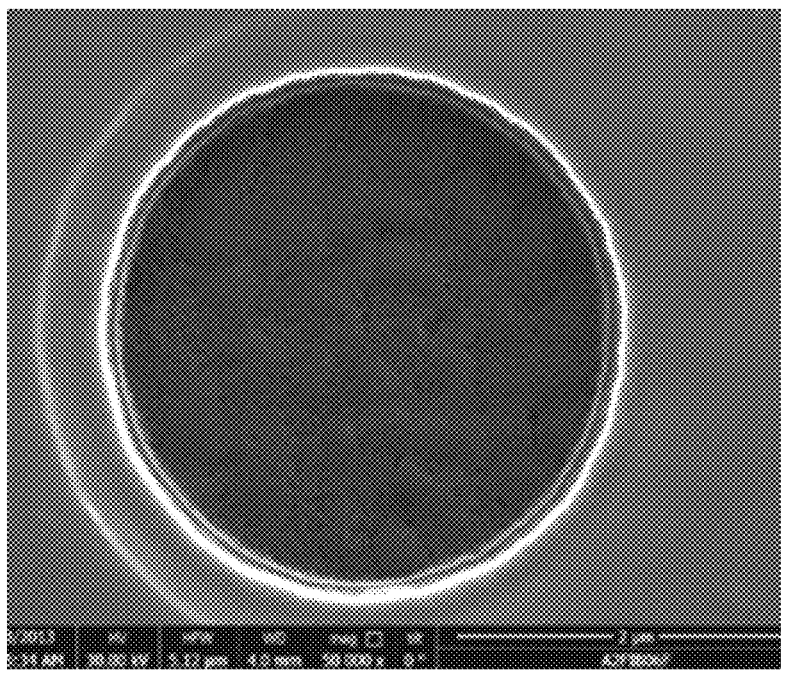
FIG. 18 is a surface image of a titanium nitride layer in which an atomic ratio of nitrogen to titanium is 1.

FIG. 15 is a surface image of a titanium layer. FIG. 16 is a surface image of a titanium nitride layer in which an atomic ratio of nitrogen to titanium is 0.5. FIG. 17 is a surface image of a titanium nitride layer in which an atomic ratio of nitrogen to titanium is 0.8. FIG. 18 is a surface image of a titanium nitride layer in which an atomic ratio of nitrogen to titanium is 1.

As in the exemplary embodiment as described above, the second capping layer 450 of the gate electrode 130 may include the titanium nitride, and the atomic ratio of the nitrogen to the titanium may be 0.8 or more.

Referring to FIG. 15, it could be seen that when a BOE cleaning liquid was sprayed on a titanium single layer, damage expressed as black stains occurred in a plurality of regions.

Referring to FIG. 16, it could be seen that when a BOE cleaning liquid was sprayed on the titanium nitride layer in which the atomic ratio of the nitrogen to the titanium is 0.5, damage expressed as black stains occurred in regions relatively smaller than those of FIG. 15.

Referring to FIG. 17, it could be seen that when a BOE cleaning liquid was sprayed on the titanium nitride layer in which the atomic ratio of the nitrogen to the titanium is 0.8, black stains were not observed, such that damage did not occur.

Referring to FIG. 18, it could be seen that when a BOE cleaning liquid was sprayed on the titanium nitride layer in which the atomic ratio of the nitrogen to the titanium is 1, damage did not occur as in FIG. 17.

It could be seen through this result that the second capping layer 450 was not damaged by the BOE cleaning liquid by making the atomic ratio of the nitrogen to the titanium in the second capping layer 450 including the titanium nitride 0.8 or more. Accordingly, it might be confirmed that the second capping layer 450 may protect the conductive layer 400 disposed therebelow from the BOE cleaning liquid.

As described above, in an exemplary embodiment, by forming the first capping layer 420 on the conductive layer 400 to form the mixed region including the titanium-aluminum alloys, it is possible to prevent the conductive layer 400 from being lost due to the high heat of the laser.

In addition, in an exemplary embodiment, by forming the second capping layer 450 on the first capping layer 420, it is possible to prevent the hillock from occurring on the surface of the conductive layer 400 and it is possible to prevent the conductive layer 400 from being eroded by the cleaning liquid.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A conductive pattern comprising:
a conductive layer including aluminum;
a first capping layer disposed on the conductive layer and including titanium; and
a second capping layer disposed on the first capping layer and including titanium nitride,
wherein a mixed region in which the aluminum and the titanium are mixed with each other is disposed in at least portions of the conductive layer and the first capping layer.

2. The conductive pattern of claim 1, wherein the conductive layer includes aluminum alone or an aluminum alloy.

3. The conductive pattern of claim 2, wherein the aluminum alloy includes additive materials, and the additive materials include one or more of nickel, lanthanum, titanium, and neodymium.

4. The conductive pattern of claim 3, wherein a content of the additive materials is within a range and including 0.1 to 1 at % based on a total aluminum alloy.

5. The conductive pattern of claim 1, wherein the conductive layer has a thickness within a range and including 1500 to 4000 Å.

6. The conductive pattern of claim 1, wherein the first capping layer has a thickness within a range and including 50 to 300 Å.

7. The conductive pattern of claim 1, wherein the second capping layer has a thickness within a range and including 500 to 1000 Å.

8. The conductive pattern of claim 1, wherein the mixed region includes aluminum-titanium alloys (TiAlx).

9. The conductive pattern of claim 1, wherein the mixed region has a concentration gradient in which a content of the titanium gradually decreases toward a lower surface of the conductive layer in the mixed region.

10. The conductive pattern of claim 1, wherein the mixed region includes $TiAl_3$ alloys, $TiAl_2$ alloys, and TiAl alloys.

11. The conductive pattern of claim 10, wherein the $TiAl_3$ alloys are adjacent to the second capping layer in the mixed region, and the TiAl alloys are adjacent to a lower surface of the conductive layer in the mixed region.

12. The conductive pattern of claim 8, wherein the mixed region has a thickness of 100 to 600 Å.

13. The conductive pattern of claim 1, wherein an atomic ratio of nitrogen to titanium in the second capping layer is 0.8 or more.

14. A display device comprising:
a substrate;
at least one transistor disposed on the substrate; and
a light emitting element disposed on the transistor,
wherein the transistor includes at least one conductive pattern, and
wherein the conductive pattern includes:
a conductive layer including aluminum;
a first capping layer disposed on the conductive layer and including titanium; and
a second capping layer disposed on the first capping layer and including titanium nitride, and
wherein a mixed region in which the aluminum and the titanium are mixed with each other is disposed in at least portions of the conductive layer and the first capping layer.

15. The display device of claim 14, wherein the at least one conductive pattern includes a gate electrode.

16. The display device of claim 15, wherein the at least one transistor includes a semiconductor layer, the gate electrode disposed on the semiconductor layer, and a source electrode and a drain electrode each connected to the semiconductor layer.

17. The display device of claim 14, wherein the conductive pattern further includes a third capping layer disposed on the second capping layer and including the same material as the first capping layer and a fourth capping layer disposed on the third capping layer and including the same material as the second capping layer.

18. The display device of claim 14, wherein the mixed region includes aluminum-titanium alloys (TiAlx).

19. The display device of claim 14, wherein the mixed region has a concentration gradient in which a content of the titanium gradually decreases toward a lower surface of the conductive layer in the mixed region.

20. The display device of claim 14, wherein the mixed region includes $TiAl_3$ alloys, $TiAl_2$ alloys, and TiAl alloys, and
the $TiAl_3$ alloys are adjacent to the second capping layer in the mixed region, and the TiAl alloys are adjacent to a lower surface of the conductive layer in the mixed region.

* * * * *